United States Patent
McElwee

(10) Patent No.: US 8,433,265 B2
(45) Date of Patent: Apr. 30, 2013

(54) PROVIDING A TEMPERATURE DEPENDENT BIAS FOR A DEVICE

(75) Inventor: James Francis McElwee, Austin, TX (US)

(73) Assignee: Javelin Semiconductor, Inc., Austin, TX (US)

( * ) Notice: Subject to any disclaimer, the term of this patent is extended or adjusted under 35 U.S.C. 154(b) by 659 days.

(21) Appl. No.: 12/578,819

(22) Filed: Oct. 14, 2009

(65) Prior Publication Data

US 2011/0086594 A1    Apr. 14, 2011

(51) Int. Cl.
*H01Q 11/12* (2006.01)
*H04B 1/04* (2006.01)

(52) U.S. Cl.
USPC ............... 455/127.1; 455/114.2; 330/272

(58) Field of Classification Search .... 455/114.2–114.3, 455/127.1–127.5; 330/272, 289, 256
See application file for complete search history.

(56) References Cited

U.S. PATENT DOCUMENTS

| | | | |
|---|---|---|---|
| 4,317,184 A | 2/1982 | Leszczynski | |
| 4,633,165 A | 12/1986 | Pietkiewicz et al. | |
| 4,789,819 A | 12/1988 | Nelson | |
| 5,608,347 A | 3/1997 | Kearney | |
| 6,507,238 B1 | 1/2003 | Yang | |
| 6,512,412 B2 | 1/2003 | Casper | |
| 6,566,849 B1 | 5/2003 | Chavan et al. | |
| 6,940,339 B2 * | 9/2005 | Otaka | 327/543 |
| 7,991,437 B2 * | 8/2011 | Camuffo et al. | 455/574 |
| 2004/0169537 A1 * | 9/2004 | Abbasi et al. | 327/158 |
| 2009/0243727 A1 | 10/2009 | Bockelman et al. | |
| 2010/0093291 A1 * | 4/2010 | Embabi et al. | 455/127.2 |

OTHER PUBLICATIONS

U.S. Appl. No. 12/317,819, filed Dec. 30, 2008, entitled "An Output Gain Stage for a Power Amplifier," by Vishnu Srinivasan, et al.

* cited by examiner

*Primary Examiner* — Christian Hannon
(74) *Attorney, Agent, or Firm* — Trop, Pruner & Hu, P.C.

(57) ABSTRACT

In one embodiment, a method includes generating a first current in a bias current circuit and biasing an amplifier with the first current when the amplifier is operating in a first temperature range, and generating a second current in the bias current circuit and biasing the amplifier with the second current when the amplifier is operating in a second temperature range. These two currents may correspond to different profiles with respect to temperature, to maintain substantial linearity of the amplifier over the temperature ranges.

16 Claims, 7 Drawing Sheets

US 8,433,265 B2

PROVIDING A TEMPERATURE DEPENDENT BIAS FOR A DEVICE

BACKGROUND

Power amplifiers (PAs) can be used in many different types of applications. For example, PAs are typically used in wireless devices such as cellular telephones and mobile Internet devices to amplify an outgoing radio frequency (RF) signal to a sufficient power level for transmission, e.g. to a cellular or other wireless network. Such power amplifiers often include one or more gain stages which can be formed of different types of semiconductor devices such as transistors.

In general, it is desirable for the PA to output a signal having a substantially constant gain over a temperature operating range of the device. However, certain PAs can suffer from large gain variations at different temperatures, if not supplied with a temperature dependent bias. As such, it is desirable to limit gain variation as the PA operates at different temperatures. One common method for compensation of gain as temperature changes is to use so-called PTAT currents, which are proportional to absolute temperature, to provide a bias current that increases with temperature. However, this temperature dependent current can negatively impact linearity characteristics of the PA. Thus a need exists for improved control of a PA or other amplifier to reduce gain variation.

SUMMARY OF THE INVENTION

According to one aspect of the present invention, a method includes generating a first current in a bias current circuit and biasing an amplifier with the first current when the amplifier is operating in a first temperature range, and generating a second current in the bias current circuit and biasing the amplifier with the second current when the amplifier is operating in a second temperature range. These two currents may correspond to different profiles with respect to temperature ranges. In some implementations, the currents can be generated with different weighted combinations of a constant current and a temperature dependent current.

Another aspect of the present invention is directed to a circuit for generating an output current that can be used as a bias current for an amplifier or other circuit. In one implementation, the circuit may include multiple differential pairs each including pairs of metal oxide semiconductor field effect transistors (MOSFETs). Each MOSFET of the pairs can be gated by a different temperature dependent voltage. Output terminals of one of the MOSFETs of each pair can be coupled to an output node to provide an output current according to a multi-level profile with respect to temperature. This profile may have different slopes in different temperature ranges. A voltage generator can generate the temperature dependent voltages, which may correspond to a differential voltage that varies with respect to temperature.

Yet another aspect is directed to a system having a transceiver to receive baseband signal information from a baseband processor and to output a radio frequency (RF) signal, an amplifier to amplify the RF signal, and a current generator to generate a bias current for the amplifier. As discussed above, the bias current can be temperature dependent and have multiple profiles in different temperature ranges. In this way, a reduced variation of a gain characteristic curve with respect to temperature can be realized, while maintaining substantial linearity.

DETAILED DESCRIPTION

In various embodiments, a technique may provide a temperature dependent bias for an amplifier, e.g., a gain stage of a PA. By providing a temperature dependent bias, the output of the gain stage may have reduced gain variation across a temperature profile at which the device may operate, while maintaining desired gain characteristic curves which are related to linearity. Specific circuits for providing this temperature dependent bias will be discussed further below.

Figure 1:
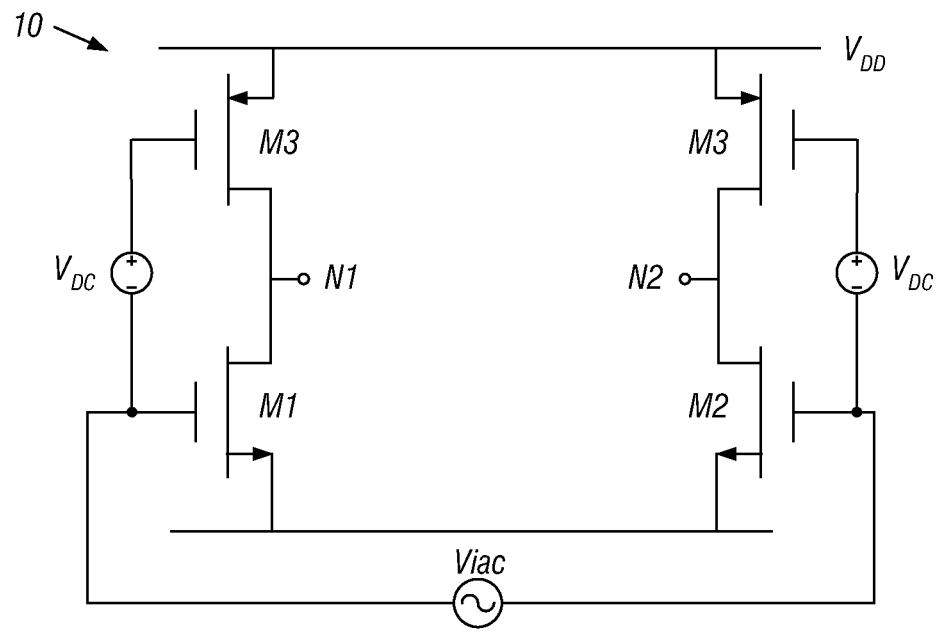
FIG. 1 is a schematic diagram of an example gain stage in accordance with one embodiment of the present invention.

However, a discussion of an example amplifier and the gain variation that is possible over a temperature profile first discussed. Referring now to FIG. 1, shown is a schematic diagram of an example gain stage. In the embodiment of FIG. 1, gain stage 10, which may be one of multiple gain stages of a PA such as a complementary metal-oxide-semiconductor (CMOS) PA, may be formed of complementary pairs of metal-oxide-semiconductor field effect transistors (MOSFETs) M1-M4 configured as a differential H-bridge. As seen in FIG. 1, gain stage 10 includes a pair of n-channel MOSFET (NMOS) devices M1 and M2 coupled in a common-source configuration with their source terminals commonly coupled and drain terminals coupled to output nodes N1 and N2. In turn, NMOS devices M1 and M2 are driven at their gates by an input signal $V_{IAC}$, which is a signal-dependent voltage to be amplified and output by output stage 10. In addition, the complementary stage includes a pair of p-channel MOSFET (PMOS) devices M3 and M4 having source terminals coupled to a supply voltage, $V_{DD}$, and drain terminals coupled to output nodes N1 and N2. As seen, the gate terminals of the PMOS devices are driven by the input signal $V_{IAC}$ at a common mode DC voltage difference of $V_{DC}$ from the NMOS devices.

The quiescent current is defined as the current flowing when $V_{IAC}$ equals 0. In this case, the current value is determined by the NMOS and PMOS DC gate voltages. This quiescent current, along with device sizes and characteristics, sets the small signal gain of output stage 10. Because stage 10 is intended to operate as a large signal amplifier, as well as small signal, the devices will "self bias" as $V_{IAC}$ increases. That is, as input voltage amplitude increases, average current increases from the DC/quiescent value. The self bias is related to the nonlinear I/V characteristics of the MOSFET device.

Specifically, as signal ($V_{IAC}$) amplitude increases, the nonlinear (super-linear) device characteristics cause the effective transconductance (GM) to increase. This effect is especially pronounced for devices with quiescent $V_{ON}$ that is very small relative to input signal swing. This causes the output stage gain to increase as signal swing increases. During roll off after gain peaks, as the input amplitude further increases, output clipping occurs, where the stage begins to saturate in a classic amplifier sense, as devices begin to approach/enter the triode region, and gain reduces.

Figure 2:
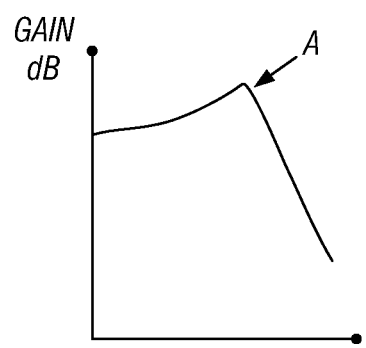
FIG. 2 is a graphical representation of gain versus input voltage for a gain stage in accordance with one embodiment of the present invention.

When taking all of these effects into account, a gain stage may be designed to have the gain characteristics (gain vs. input amplitude), shown in FIG. 2. As seen in FIG. 2, although the gain profile is not entirely linear, it is substantially linear over a relatively wide input voltage range. Further, note that while the peaking (occurring around point A) and compression (occurring after point A) may be in the normal operating range of the gain stage, the linearity of the gain stage is not sufficiently affected such that it would fail typical linearity specifications, as the change in gain remains within approximately 0.5 dB.

With a basic understanding of these gain curves/characteristics, we can now begin to investigate the temperature effect on gain and linearity. For MOSFETs, in general the greatest effects of temperature are on mobility ($\mu$) and threshold voltage ($V_T$). Basic bias techniques can remove the effects of temperature on threshold voltage. This leaves the impact of mobility, which reduces at higher temperatures, resulting in gain reduction at higher temperatures. This gain reduction with respect to temperature can be difficult to resolve, as it would require temperature dependent calibration, which can be difficult to implement (unlike process variation, which can be removed with a one-time calibration).

Note that gain profiles with respect to input voltage (expansion, peaking, compression) such as seen in FIG. 2, do not change significantly with temperature, as the drain current ($I_D$)/$V_{GS}$ characteristics are relatively unaffected as temperature changes. That is, although the gain values themselves may change with respect to temperature, the gain characteristics or gain profile with respect to temperature does not significantly change.

As described above, a PTAT bias current can be used to compensate for temperature changes. Such a PTAT current may be generated on chip in a manner such that as the input temperature increases, so too does the PTAT current. This PTAT current can be used to counter the mobility reduction in the following gm equation:

$$gm=\sqrt{2I\mu C_o w/L} \qquad [\text{EQ. 1}]$$

where I is a bias current designed to increase with increasing temperature in the case of a PTAT current, $\mu$ is the mobility, which decreases with temperature, $C_0$ is the oxide capacitance, and W/L is a measure of the device size.

Although a PTAT bias technique can be used to control the small signal gain with temperature, this technique can have a significant impact on the gain curve characteristics. At large signal operation, the average Gm (related to gain) becomes determined more by drive conditions ($V_{IAC}$) than by $V_{ON}$ (i.e., $V_{IAC} \gg V_{ON}$). In this case, it makes less difference whether the quiescent currents are different between a PTAT current or a constant current case, as the Gm/gain values for these cases tend to converge.

When using a PTAT current, however, much larger peaking may occur, particularly at lower temperatures, as the device is basically starved of current at quiescent, and has a large signal gain that is similar to a constant current bias (due to the self bias). This behavior of a PTAT bias circuit can have a negative impact on linearity, as the excessive expansion results in significant distortion.

Thus in various embodiments a trade-off may be implemented between biasing a gain stage with PTAT and constant currents. This trade-off may maintain an acceptable level of linearity, while decreasing small signal gain variation. In this way, a bias profile can be implemented that does not diminish the quiescent current significantly at cold temperatures but still boosts current (to maintain gain) at hot temperatures. Thus in various embodiments, the trade-off may be made to favor linearity at the expense of slight gain variation. However, the gain variation using a multi-level current profile in accordance with an embodiment of the present invention may be relatively small, e.g., on the order of approximately 1.5 dB, while maintaining linearity in a range sufficient to pass requirements for applications such as a PA.

Figure 3A:
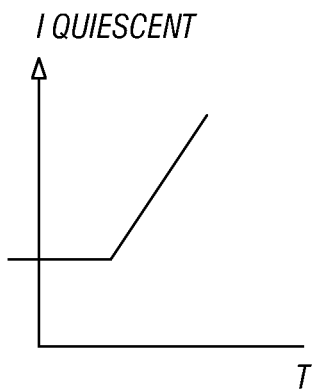
FIGS. 3A and 3B are graphical representations of multi-level bias current profiles with regard to temperature in accordance with one embodiment of the present invention.
Figure 3B:
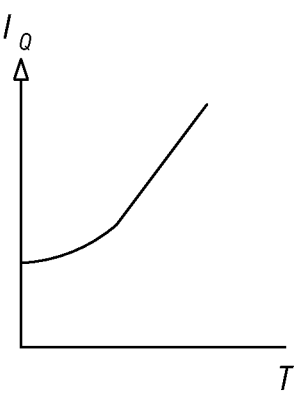

While the scope of the present invention is not limited in this regard, examples of a multi-bias current profile approach are shown in FIGS. 3A and 3B. As seen in the illustrations of FIGS. 3A and 3B, which show quiescent current versus temperature, the bias current profile increases in a multi-level manner as temperature increases. In the example in these figures a two-level approach is shown, with the change in the profile occurring at a temperature of T0, which may correspond to a nominal (e.g., room temperature) value, in some embodiments.

In sum, the aggressiveness or slope of the current variation with temperature can be reduced at lower temperatures to preserve linear operation. Generally, this would be done by allowing the gain to be maintained as constant as possible as temperature goes lower (bias current would reduce) until the linearity limit is reached. As temperature goes higher, the current profile can be more aggressive (i.e., higher slope with temperature) as the $V_{ON}$ will increase, and the operation will become more class A (with linearity not negatively impacted).

Different techniques may be provided to create this type of bias temperature profile by mixing a plurality of individual currents as a function of temperature. Each of these currents can have desired characteristics for different temperature ranges, e.g., cold and hot, respectively. For example, in one embodiment two individual currents may be mixed, with one current having characteristics (e.g., a lower or zero slope) for a first temperature range (e.g., a low temperature range) of between approximately −40 and 27 degrees Celsius (C) and the second current may have characteristics (e.g., a higher slope) for higher temperatures (e.g., higher than approximately 27° C.). While only two such currents are described for ease of illustration, embodiments may combine more than two currents each associated with a different temperature range. In one embodiment, the temperature may be determined using an on-chip sensor, which may be obtained from a bandgap circuit.

Figure 4:
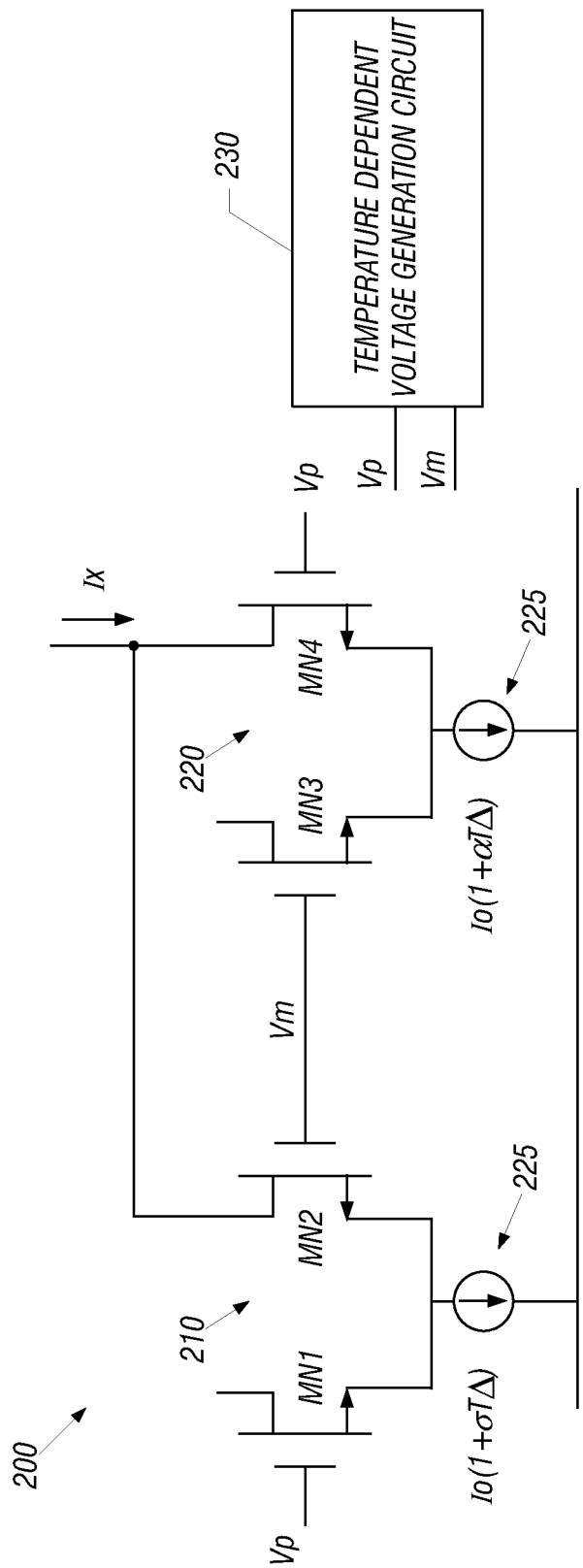
FIG. 4 is a schematic diagram of a temperature dependent bias current generator circuit in accordance with one embodiment of the present invention.

Referring now to FIG. 4, shown is a schematic diagram of a temperature dependent bias current generator circuit in accordance with one embodiment of the present invention. As shown in FIG. 4, circuit 200 may include two differential pairs of devices, namely a first differential pair 210 and a second differential pair 220. As seen, each differential pair is formed of a pair of NMOS devices MN1 and MN2, and MN3 and MN4, respectively. The source terminals of each of the differential pairs are commonly coupled to a current source, the details of which will be discussed further below. NMOS devices MN1 and MN4 are gated by a first voltage $V_P$, while NMOS devices MN2 and MN3 are gated by a second voltage $V_M$. In turn, the drain terminals of devices MN2 and MN4 are coupled together and provide the combined output current $I_X$, which may be provided as a bias current to one or more output stages of an amplifier or other such device. Alternately, further processing may be performed on the output current before it is provided as a bias current. In some embodiments, the output current can be provided to a current mirror for amplification to obtain the bias current. Note that the drain terminals of NMOS devices MN1 and MN3 may be coupled to a dummy load, which in one embodiment may be a replica current mirror to that coupled to NMOS devices MN2 and MN4.

As further seen in FIG. 4, a voltage generation circuit 230, which may be a temperature dependent voltage generator, can be used to generate the two bias voltages $V_P$ and $V_M$. Voltage generation circuit 230 creates a differential voltage that varies in some way (e.g., linearly) with temperature. In some implementations, the differential voltage may cause the differential pair devices to rail or saturate at hot/cold extremes, resulting in a bias current that follows the desired profile at these temperatures. As an example as temperature deviates more from an ambient value, the differential voltage becomes greater and one of the pairs will be completely on and the other completely off.

As further seen in FIG. 4, current sources 215 and 225 may couple different currents to the two differential pairs. Specifically, current source 215 may provide a value that is optimized for a first temperature range, e.g., a lower temperature range, while current source 225 may provide a current source value optimized for a second current range, e.g. a higher current range. As will be discussed below, the currents provided to the differential pairs may be formed of weighted combinations of constant and temperature dependent currents. In the implementation shown in FIG. 4, differential pair 210 is provided a current of $I_0(1-\sigma T_A)$ and differential pair 220 is provided a current of $I_0(1+\alpha T_A)$, where $I_A$ is a constant current, $\alpha$ and $\sigma$ are weighting coefficients (and where $\sigma$ may be less than $\alpha$), and the term $T_A$ represents a delta from a nominal temperature. Note that the current profiles need not be linear, and that $\sigma$ and $\alpha$ need not be non-zero. In one embodiment, the multiple current sources may be implemented as one or more current steering cells that constitute a switch between the differential pairs, and as temperature varies the current provided is controlled by voltage generator 230. While shown with only two sets of differential pairs (and corresponding current sources) in the embodiment of FIG. 4, the scope of the present invention is not limited in this regard and in various implementations more than two such pairs may be provided. For example, in one embodiment multiple cells including multiple differential pairs may be present, with the output currents of each combined to generate a current having three or more individual profiles.

Figure 5:
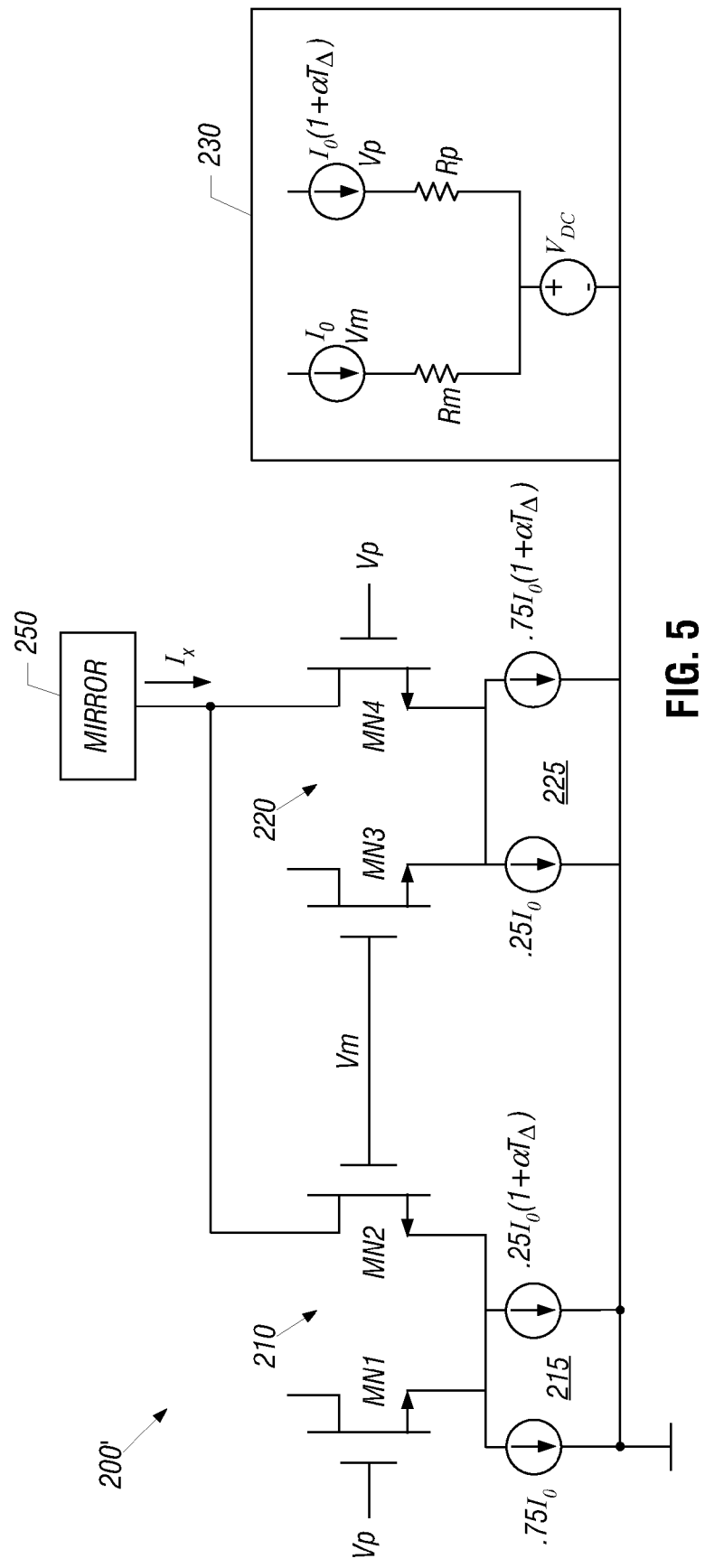
FIG. 5 is a schematic diagram of a bias current generator in accordance with yet another embodiment of the present invention.

Referring now to FIG. 5, shown is a schematic diagram of a bias current generator in accordance with yet another embodiment of the present invention. As shown in FIG. 5, circuit 200' may generally correspond to that of circuit 200 of FIG. 4. However, further details are provided. Specifically, a particular implementation of the current sources 215 and 225 are shown. In addition, details of the voltage generation circuit 230 are shown, where current sources are coupled to a respective resistor, which in turn is coupled to a DC voltage source that provides a common mode set point. Also in the implementation of FIG. 5 the output current $I_X$ may be provided to a current mirror 250 for amplification to a desired level, where the output from the current mirror can then be provided to one or more output gain stages.

As seen in the embodiment of FIG. 5, the current sources may be implemented using currents generated on chip. Specifically, in the embodiment of FIG. 5, two currents may be obtained from a bandgap, namely a first current $I_O$ that is a bandgap controlled, constant current and a second current that is temperature dependent, such as a PTAT current, e.g., $I_O(1+\alpha T_A)$, where $\alpha$ is a constant that defines the proportion of current changes to temperature change. Rather than a PTAT current, another temperature dependent current such as a constant GM current may be used along with a constant current.

As seen, differential pair 210 is biased with a current having a relatively low slope with respect to temperature (75% constant current, 25% PTAT current in the embodiment of FIG. 5), while differential pair 220 is biased with a current having a higher slope with regard to temperature (25% constant current, 75% PTAT current in the embodiment of FIG. 5). The percentages of the two currents that form the current sources can be realized by current mirrors with scaled ratios or current dividers, in some embodiments.

At very low temperatures (e.g., −20° C.), voltage generator 230 will cause $V_M$ to be larger than $V_P$ (the difference may vary depending on DC characteristics (Vo/Vi) and characteristics of the differential pair), and:

$$I_X \approx .75I_O + .25I_O(1+\alpha T_A)$$
$$= I_O + .25I_O\alpha T_A.$$

At high temperatures, voltage generator 230 causes $V_P \gg V_M$, and:

$$I_X \approx .75I_O(1+\alpha T_A) + .25I_O$$
$$= I_O + .75I_O\alpha T_A.$$

Figure 6:
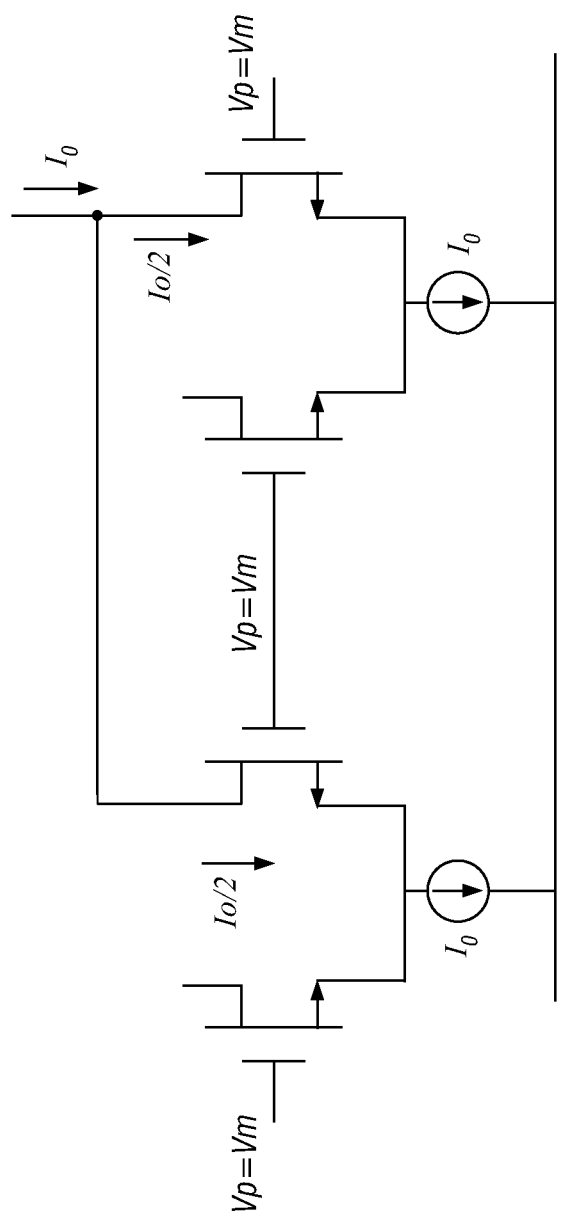
FIG. 6 is a schematic diagram of a balanced circuit in accordance with one embodiment of the present invention.

In one embodiment, the circuit may be set such that at $T_A=0$ (nominal temperature, e.g., T=27° C./300K), $V_P=V_M$ (implies $R_M=R_P$), and the circuit is balanced (mismatch effects aside), as shown in FIG. 6. Note that current sources 215 and 225 are equal at a value of the constant current, since there is no temperature variance ($T_A$) from the nominal temperature $T_0$. In one embodiment, $I_O$ sets the nominal design point, usually (but not necessarily) at room temperature ambient. This configuration creates the profile illustrated in FIG. 3B.

Although the bias/temperature profiles described above with specific reference for the hot and cold cases where a differential pair is saturated, in the transition region (around $T_A=0$) the behavior is determined by the large signal characteristics of the devices, and the slope of $V_P-V_M$. Note that there need not be an instantaneous switch when temperature varies from an ambient, as in a transition region both differential pairs can be in a transition region, both providing current that is combined.

In an embodiment in which there are multiple gain stages, a single current generator may be provided, although the scope of the present invention is not limited in this regard. Note that in many implementations, the current profiles need not be fixed, and can be programmable, e.g., by varying the slopes. In addition, programmability can be realized by changing the temperature ranges (by the voltage generator output) for the operative profiles. In one embodiment, such control can be via control of the weighting coefficients ($\alpha$ and $\sigma$). In some embodiments, the programmability can be realized by off-chip control, e.g., from a baseband processor or a transceiver.

Figure 7:
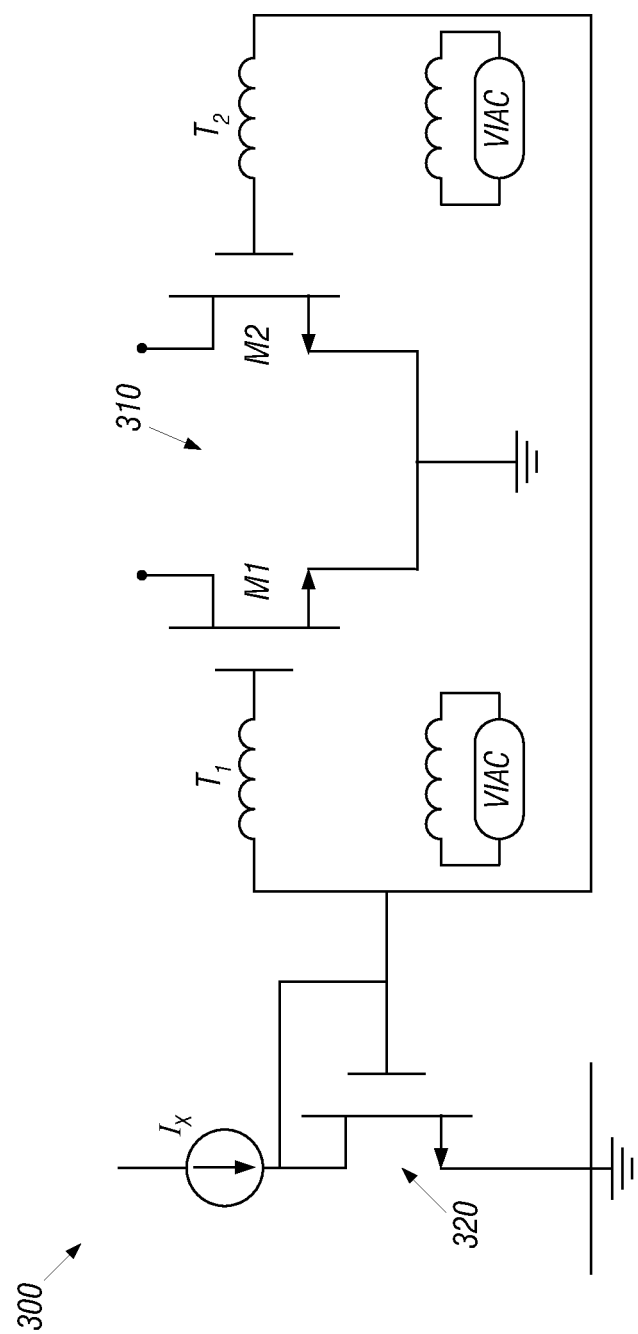
FIG. 7 is a schematic diagram of a coupling of a bias current to a gain stage using a transformer implementation.

In different embodiments, a bias current generator can be coupled to a gain stage in different manners. In one embodiment, a magnetic coupling via transformers may be implemented. Referring now to FIG. 7, shown is a schematic diagram of a coupling of a bias current to a gain stage using a transformer implementation. As seen in FIG. 7, a circuit 300 includes a gain stage 310 generally formed of a differential pair including common-source NMOS devices M1 and M2. As seen, these devices are driven at their gates by an output of a respective transformer T1 and T2 having secondary coils coupled to the respective gates. To provide a bias current to these gate terminals, a current source $I_x$, which may be the output of a bias current circuit such as that shown in FIG. 5 may be coupled through a diode-connected NMOS device 320 to the secondary coils of transformers T1 and T2. Note that an incoming AC signal, e.g., an incoming RF signal to be transmitted from the gain stage, may be coupled to the primary coils of transformers T1 and T2. While shown with a particular implementation and embodiment of FIG. 7, the scope of the present invention is not limited in this regard, and a bias current can be coupled to a gain stage or other amplifier in many different ways.

Figure 8:
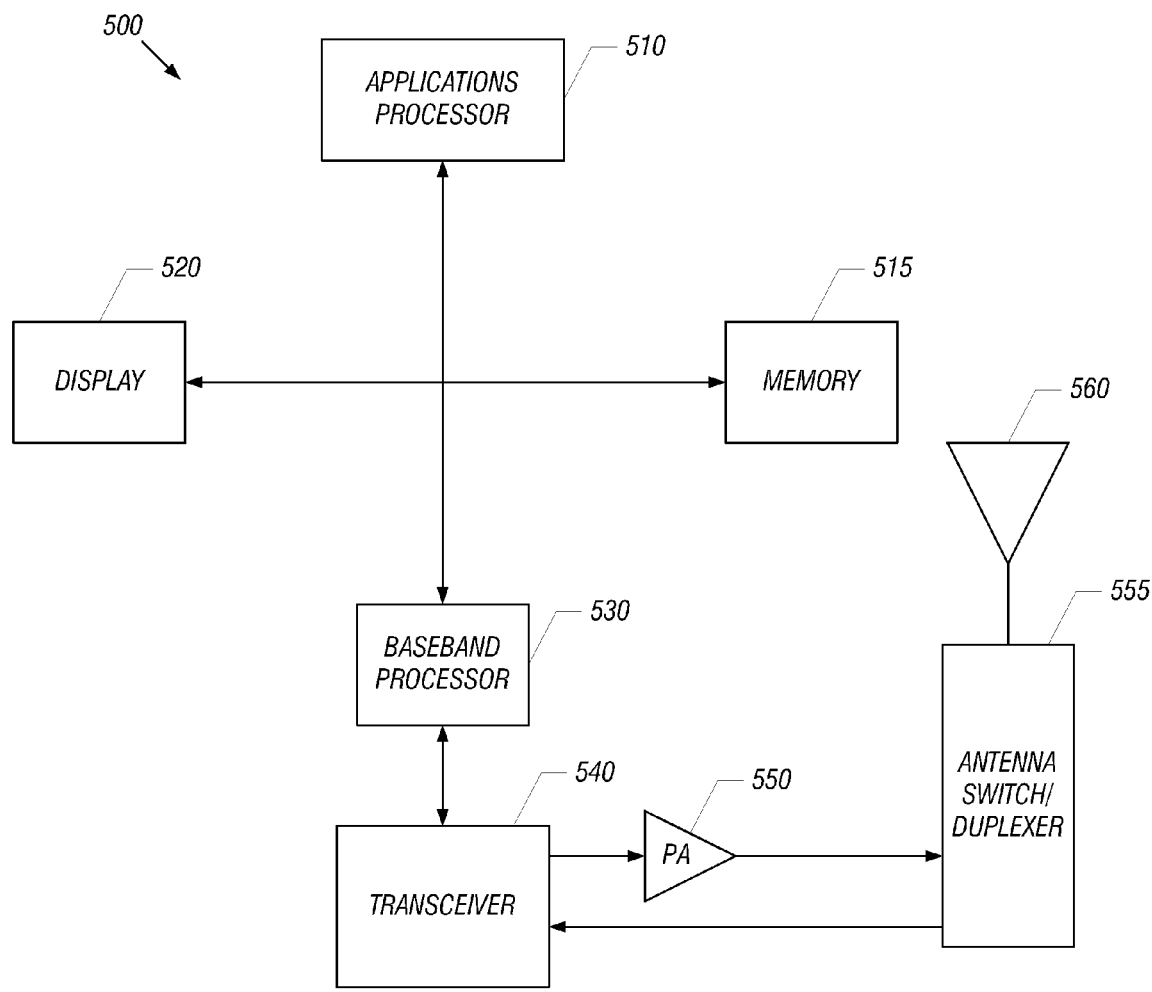
FIG. 8 is a block diagram of a wireless device in accordance with an embodiment of the present invention.

As described above, bias current generation circuitry in accordance with an embodiment of the present invention can be implemented in a PA such as a CMOS PA. Such a device can be used in various wireless systems, including handsets, mobile devices, PDAs and so forth. Referring now to FIG. 8, shown is a block diagram of a wireless device 500 in accordance with an embodiment of the present invention, and which may be a 2G, 2.5G, 3G or 4G smart phone, for example. As shown in FIG. 8, wireless device 500 may include an applications processor 510 which may be a microprocessor or other programmable logic to handle various system features, such as running application programs desired by a user. To perform its functions, applications processor 510 may communicate with a memory 515, which may be a flash memory or other non-volatile memory. Applications processor 510 may further communicate with a display 520, such as an LCD display of the system. For handling RF communications, e.g., wireless phone calls, wireless data transmissions and so forth, e.g., according to a W-CDMA, OFDMA, or other protocol, applications processor 510 may communicate with a baseband processor 530, which may handle baseband operations both for transmit and receive paths. In turn, baseband processor 530 is coupled to a transceiver, which may receive incoming baseband signals from baseband processor 530, and perform processing to upconvert the signals to RF levels for transmission to a PA 550. PA 550 may be a power amplifier in accordance with an embodiment of the present invention that includes one or more gain stages provided with a temperature dependent bias current as described above. In turn, PA 550 may be coupled to an antenna switch, duplexer or both 555 which in turn is coupled to an antenna 560, which radiates the amplified RF signal.

In a receive path, antenna 560 couples through antenna switch 555 and possibly through the duplexer or SAW filters and then to transceiver 540, which may demodulate the incoming RF signals back to baseband for transmission to baseband processor 530 for further processing. While shown with this particular implementation in the embodiment of FIG. 8, the scope of the present invention is not limited in this regard.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
   generating a first current using a first weighted combination of a constant current and a temperature dependent current in a bias current circuit and biasing an amplifier with the first current when the amplifier is operating in a first temperature range, the first current according to a first portion of a multi-level current profile with respect to temperature; and
   generating a second current using a second weighted combination of the constant current and the temperature dependent current in the bias current circuit and biasing the amplifier with the second current when the amplifier is operating in a second temperature range, the second current according to a second portion of the multi-level current profile with respect to temperature.

2. The method of claim 1, further comprising determining a temperature of the amplifier using an on-chip sensor, wherein the chip comprises a power amplifier (PA) and the amplifier is of a gain stage of the PA.

3. The method of claim 2, further comprising maintaining linearity characteristics of the amplifier substantially steady while reducing gain variation of the amplifier in the first and second temperature ranges using the first and second currents.

4. The method of claim 1, wherein the first weighted combination includes more of the constant current than the second weighted combination.

5. An apparatus comprising:
   a first differential pair including a first metal oxide semiconductor field effect transistor (MOSFET) and a second MOSFET, the first and second MOSFETs having first terminals coupled to a first current source, the first MOSFET gated by a first temperature dependent voltage and the second MOSFET gated by a second temperature dependent voltage; and
   a second differential pair including a third MOSFET and a fourth MOSFET, the third and fourth MOSFETs having first terminals coupled to a second current source, the third MOSFET gated by the second temperature dependent voltage and the fourth MOSFET gated by the first temperature dependent voltage, wherein the second and fourth MOSFETs are to provide an output current according to a multi-level profile with respect to temperature, wherein the first current source is formed of a first weighted combination of a constant current and a temperature dependent current and the second current source is formed of a second weighted combination of the constant current and the temperature dependent current, wherein the first current source is weighted with more of the constant current than the second current source.

6. The apparatus of claim 5, wherein the multi-level profile has a first slope in a first temperature range and a second slope in a second temperature range, the first slope less than the second slope, and the first temperature range less than the second temperature range.

7. The apparatus of claim 5, further comprising a voltage generator to generate the first and second temperature dependent voltages, wherein the first and second temperature dependent voltages correspond to a differential voltage that varies with respect to temperature.

8. The apparatus of claim 7, wherein the first and second temperature dependent voltages and the first and second current sources are substantially equal, respectively at a nominal temperature.

9. The apparatus of claim 5, further comprising a current mirror to receive the output current and to provide a bias current to a first amplifier stage coupled to the current mirror.

10. The apparatus of claim 9, further comprising a transformer having a first coil coupled to receive an input signal to be provided to the first amplifier stage and having a second coil coupled to receive the bias current and to provide the input signal and the bias current to the first amplifier stage.

11. The apparatus of claim 5, wherein when the apparatus is operating in a first temperature range, the second temperature dependent voltage is to cause the first differential pair to saturate and provide the first current source as the output current, and when the apparatus is operating in a second temperature range higher than the first temperature range, the first temperature dependent voltage is to cause the second differential pair to saturate and provide the second current source as the output current.

12. A system comprising:
   a transceiver to receive baseband signal information from a baseband processor and to output a radio frequency (RF) signal;
   an amplifier to amplify the RF signal to output an amplified RF signal; and
   a current generator to generate a bias current for the amplifier, the bias current being temperature dependent and having at least a first profile in a first temperature range and a second profile in a second temperature range, to reduce variation with respect to temperature of a gain characteristic curve of the amplifier and maintain substantial linearity, the first and second profiles being different and the first and second temperature ranges being different, wherein the current generator is to generate the bias current using a first weighted combination of a constant current and a temperature variable current in the first temperature range and generate the bias current using a second weighted combination of the constant current and the temperature variable current in the second temperature range, wherein the first weighted combination includes more of the constant current than the second weighted combination.

13. The system of claim 12, wherein the first profile has a first slope in the first temperature range and the second profile has a second slope in the second temperature range, the first slope less than the second slope and the first temperature range less than the second temperature range.

14. The system of claim 13, wherein the current generator comprises:
   a first differential pair including a first metal oxide semiconductor field effect transistor (MOSFET) and a second MOSFET, the first and second MOSFETs having first terminals coupled to a first current source, the first MOSFET gated by a first temperature dependent voltage and the second MOSFET gated by a second temperature dependent voltage; and
   a second differential pair including a third MOSFET and a fourth MOSFET, the third and fourth MOSFETs having first terminals coupled to a second current source, the third MOSFET gated by the second temperature dependent voltage and the fourth MOSFET gated by the first temperature dependent voltage, wherein the second and fourth MOSFETs are to provide an output current usable as the bias current.

15. The system of claim 14, further comprising a voltage generator to generate the first and second temperature dependent voltages, wherein the first and second temperature dependent voltages correspond to a differential voltage that varies with respect to temperature, the first temperature dependent voltage generated using the temperature variable current and the second temperature dependent voltage generated using the constant current.

16. The system of claim 15, further comprising a current mirror coupled to the second and fourth MOSFETs to receive the output current and to provide the bias current to the amplifier.

* * * * *